United States Patent
Kim et al.

(10) Patent No.: US 8,181,339 B2
(45) Date of Patent: May 22, 2012

(54) METHOD OF MANUFACTURING A PRINTED CIRCUIT BOARD

(75) Inventors: Joon-Sung Kim, Suwon-si (KR);
Je-Gwang Yoo, Yongin-si (KR);
Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 952 days.

(21) Appl. No.: 12/213,703

(22) Filed: Jun. 23, 2008

(65) Prior Publication Data

US 2009/0173531 A1    Jul. 9, 2009

(30) Foreign Application Priority Data

Jan. 3, 2008    (KR) .................. 10-2008-0000799

(51) Int. Cl.
*H05K 3/02*  (2006.01)
(52) U.S. Cl. ................. 29/846; 29/830; 29/832; 29/852
(58) Field of Classification Search ............... 29/825, 29/830, 832, 840, 852
See application file for complete search history.

(56) References Cited

U.S. PATENT DOCUMENTS

| 5,108,541 | A | * | 4/1992 | Schneider et al. | ............. 216/19 |
| 5,116,459 | A | * | 5/1992 | Kordus et al. | ................. 216/20 |

FOREIGN PATENT DOCUMENTS

| JP | 2000-307217 | 11/2000 |
| JP | 2004-265967 | 9/2004 |
| JP | 2005-142573 | 6/2005 |
| KR | 1999-0062638 | 7/1999 |

OTHER PUBLICATIONS

Japanese Office Action issued Sep. 7, 2010 in corresponding Japanese Patent Application 2008-155567.
Korean Office Action issued on Aug. 31, 2009 in corresponding Korean Patent Application 10-2008-0000799.

* cited by examiner

*Primary Examiner* — Carl Arbes (57) ABSTRACT

A printed circuit board and a method of manufacturing the printed circuit board are disclosed. The method of manufacturing the printed circuit board can include forming a first protective layer over one surface of a core substrate, forming a first circuit pattern over the other surface of the core substrate by a first process, removing the first protective layer, forming a second protective layer over the other surface of the core substrate, and forming a second circuit pattern over the one surface of the core substrate by a second process.

12 Claims, 15 Drawing Sheets

METHOD OF MANUFACTURING A PRINTED CIRCUIT BOARD

CROSS-REFERENCE TO RELATED APPLICATIONS

This application claims the benefit of Korean Patent Application No. 10-2008-0000799 filed with the Korean Intellectual Property Office on Jan. 3, 2008, the disclosure of which is incorporated herein by reference in its entirety.

BACKGROUND

1. Technical Field

The present invention relates to a printed circuit board and to a method of manufacturing the printed circuit board.

2. Description of the Related Art

Electronic equipment are being produced with higher performance and smaller sizes; leading to cost increases in such electronic equipment. As such, there are efforts to lower the cost of components used in electronic equipment.

Methods of manufacturing a printed circuit board according to the related art include tenting processes and additive processes.

Whereas tenting processes allow low manufacture costs, they are limited in forming fine-line circuit patterns. Additive processes have been developed to overcome this limitation, but these have the disadvantage of incurring higher costs.

In the related art, when a copper clad laminate (CCL) is used as the material for manufacturing a printed circuit board, the method used may involve applying a tenting process on both surfaces or applying an additive process on both surfaces. One reason for this may be that both surfaces would be exposed to the etchant or the plating bath simultaneously. Thus, even in cases where a fine-line circuit pattern is required on one surface only, the same process may have to be employed for both surfaces at the same time.

In the manufacture of a printed circuit board according to the related art, there may also be problems of curling or bending, etc., as the thickness of the printed circuit board is decreased.

SUMMARY

An aspect of the invention provides a method of forming circuit patterns sequentially on both surfaces of a printed circuit board.

Another aspect of the invention provides a method of manufacturing a printed circuit board that includes forming a first protective layer over one surface of a core substrate, forming a first circuit pattern over the other surface of the core substrate by a first process, removing the first protective layer, forming a second protective layer over the other surface of the core substrate, and forming a second circuit pattern over the one surface of the core substrate by a second process.

Still another aspect of the invention provides a method of manufacturing a printed circuit board that includes attaching one surface of each of a pair of core substrates onto either surface of a first protective layer, forming a first circuit pattern over the other surface of each of the pair of core substrates by a first process, separating the pair of core substrates from the first protective layer, attaching the other surface of each of the pair of core substrates onto either surface of a second protective layer, and forming a second circuit pattern over the one surface of each of the pair of core substrates by a second process.

Certain embodiments of the invention may include one or more of the following features.

In certain embodiments, the core substrate can be a copper clad laminate (CCL).

The first process can be any one selected from a group consisting of a tenting process, a semi-additive process, and an additive process.

The second process can be any one selected from a group consisting of a tenting process, a semi-additive process, and an additive process.

The first and second protective layers can be foam tapes.

A side of the second circuit pattern may be less slanted than a side of the first circuit pattern.

An interface can be formed within the first circuit pattern.

Yet another aspect of the invention provides a printed circuit board, which includes an insulation layer, a first circuit pattern having a side slanted with respect to the insulation layer that is formed over one surface of the insulation layer, and a second circuit pattern having a side slanted with respect to the insulation layer that is formed over the other surface of the insulation layer. The side of the second circuit pattern may be less slanted than the side of the first circuit pattern.

In certain embodiments of the printed circuit board, an interface can be formed within the first circuit pattern.

Additional aspects and advantages of the present invention will be set forth in part in the description which follows, and in part will be obvious from the description, or may be learned by practice of the invention.

DETAILED DESCRIPTION

The printed circuit board and method of manufacturing the printed circuit board according to certain embodiments of the invention will be described below in more detail with reference to the accompanying drawings. Those components that are the same or are in correspondence are rendered the same reference numeral regardless of the figure number, and redundant explanations are omitted.

Figure 1:
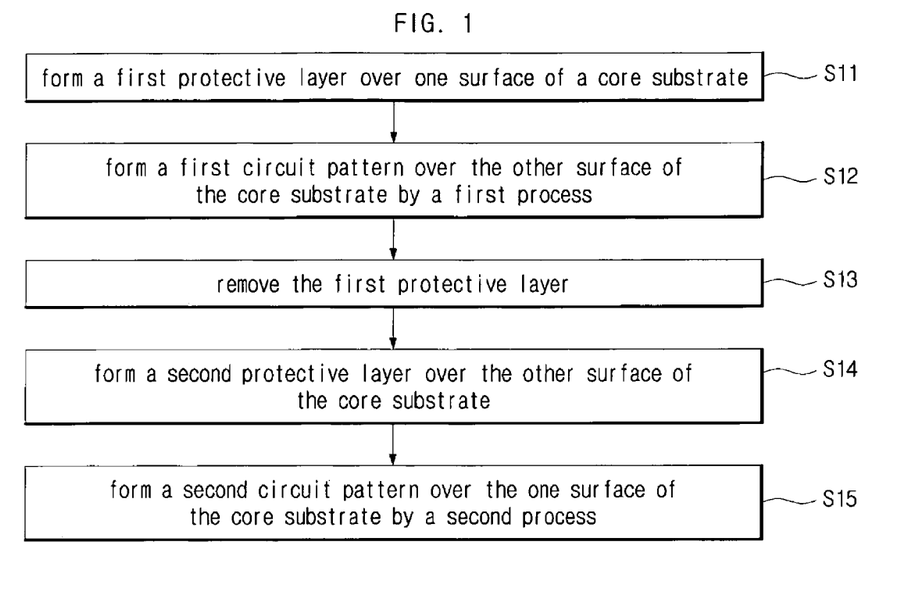
FIG. 1 is a flowchart illustrating the manufacture of a printed circuit board according to an embodiment of the invention.

FIG. 1 is a flowchart illustrating the manufacture of a printed circuit board according to an embodiment of the invention, and FIG. 2 through FIG. 7 are cross sectional views representing a flow diagram illustrating the manufacture of a printed circuit board according to an embodiment of the invention. In FIGS. 2 to 7, there are illustrated a core substrate 11, an insulation layer 111, copper foils 112, a first protective layer 12, via holes 13, a first circuit pattern 14, vias 15, a second protective layer 16, and a second circuit pattern 17.

Figure 2:
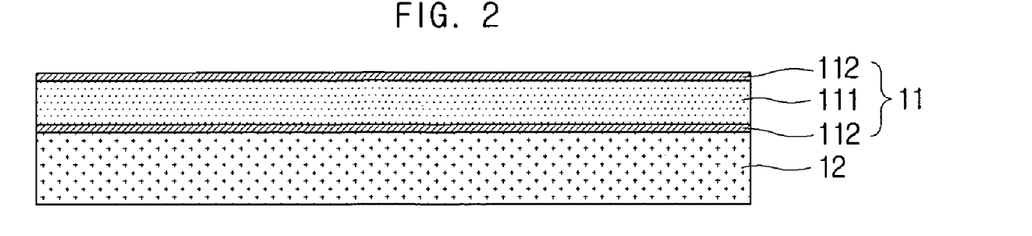
FIG. 2, FIG. 3, FIG. 4, FIG. 5, FIG. 6, and FIG. 7 are cross sectional views representing a flow diagram illustrating the manufacture of a printed circuit board according to an embodiment of the invention.

Operation S11 may include forming a first protective layer 12 over one surface of a core substrate 11, where FIG. 2 represents a corresponding procedure.

The core substrate 11 can be made from just the insulation layer. This particular embodiment, however, illustrates the use of a copper clad laminate (CCL). The copper clad laminate (CCL) can include a copper foil on just one surface of the insulation layer, or as illustrated in this particular embodiment, include copper foils 112 stacked over both surfaces of the insulation layer 111.

The thickness of a copper foil 112 can be such that allows the application of a tenting process. Also, the copper foil can be such that is thin enough to allow the application of a semi-additive process.

A tape, such as a foam tape, can be used for the first protective layer 12, whereby the surface of the core substrate 11 can be protected in a simple manner from a plating liquid or etchant, etc., making it possible to form each of the first circuit pattern 14 and second circuit pattern 17 in order.

Figure 3:
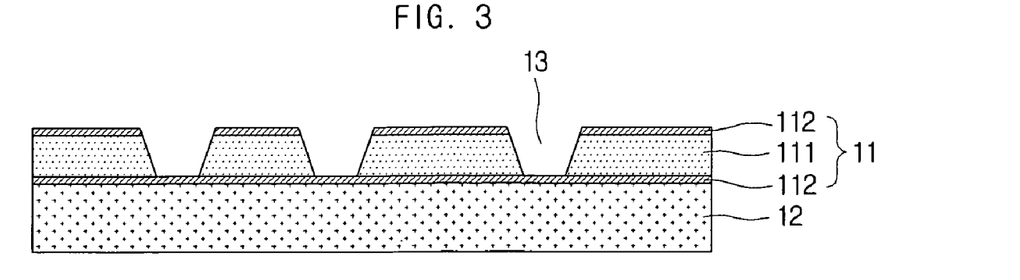
Figure 4:
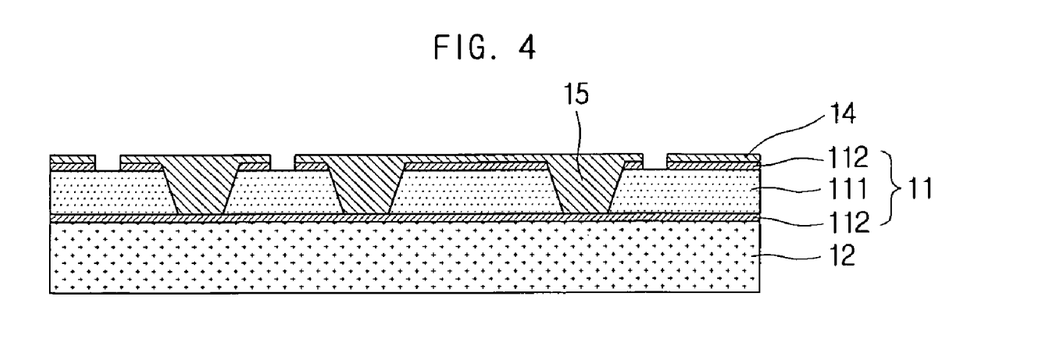

Operation S12 may include forming a first circuit pattern 14 over the other surface of the core substrate 11 using a first process, where FIG. 3 and FIG. 4 represent corresponding procedures.

Before forming the first circuit pattern 14, via holes 13 can be perforated, as illustrated in FIG. 3, in order to form vias 15 that connect the circuit patterns 14, 17 on either surface. A laser can be used for perforating the via holes 13. Afterwards, the insides of the via holes 13 can be plated to form the vias 15.

The first process can be any of a semi-additive process, tenting process, and additive process. In this particular embodiment, the first circuit pattern 14 may be formed by a tenting process. In cases where the core substrate 11 is made only of an insulation layer, an additive process may be used. An additive process may include selectively forming a circuit pattern over the insulation layer by electroless plating or electroplating. A semi-additive process may include selectively forming a circuit pattern over a thin film of copper, and then removing the exposed copper by etching.

Operation S13 may include removing the first protective layer 12. The first protective layer 12 can be physically separated or can be removed using a chemical solution. If a foam tape is used for the first protective layer 12, increasing the temperature can create bubbles in the tape, so that the adhesion may be lowered and the tape may easily be separated from the core substrate 11.

Figure 5:
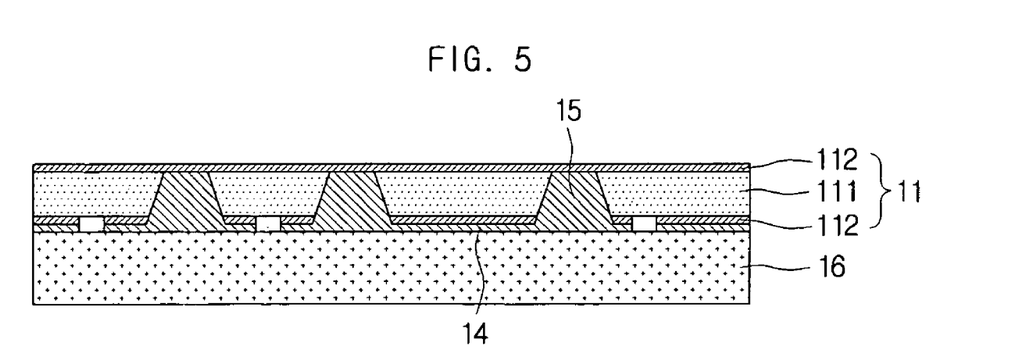

Operation S14 may include forming a second protective layer 16 over the other surface of the core substrate 11, where FIG. 5 represents a corresponding procedure.

The other surface of the core substrate 11 may already have the first circuit pattern 14 formed by the first process. Therefore, the second protective layer 16 can be attached to the other surface of the core substrate 11, in order that the first circuit pattern 14 may not be damaged. The second protective layer 16 can be made from the same material as that of the first protective layer 12.

Figure 6:
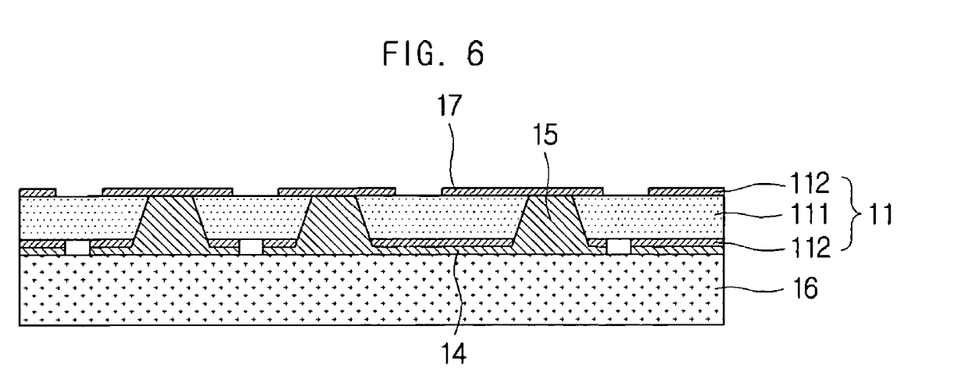

Operation S15 may include forming a second circuit pattern 17 over the one surface of the core substrate 11 using a second process, where FIG. 6 represents a corresponding procedure.

The one surface of the core substrate 11 may be exposed, after the removal of the first protective layer 12. In this particular embodiment, the core substrate 11 may be a copper clad laminate, and thus a copper foil 112 may be exposed as illustrated in FIG. 5.

The second process can be a tenting process of removing portions of the copper foil 112. If the copper foil is thin, it is possible to form the second circuit pattern 17 by a semi-additive process and then remove the exposed portions of the copper foil. If the one surface of the core substrate 11 is the insulation layer, an additive process can be used for forming the second circuit pattern 17.

In this particular embodiment, the first circuit pattern 14 can be formed using an additive or a semi-additive process, and the second circuit pattern 17 can be formed using a tenting process, so that the sides of the second circuit pattern 17 can form lower inclinations, with respect to the insulation layer 111, than the sides of the first circuit pattern 14.

One reason for this may be that, because of the tenting process, the upper portions on the sides of the second circuit pattern 17 may be exposed more to the etchant than are the lower portions and may thus be removed more.

The first circuit pattern 14, on the other hand, can have an interface formed within, because of the additional plating procedure included for forming the vias 15.

Figure 7:
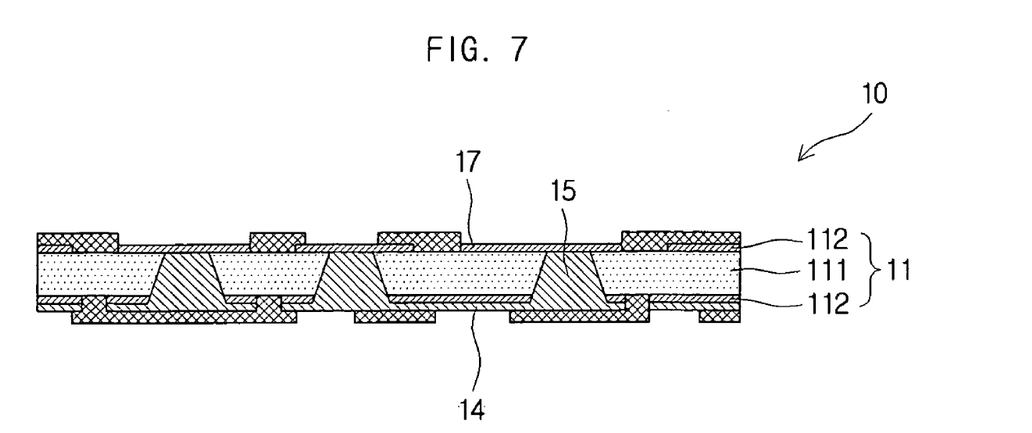

Afterwards, the second protective layer 16 can be removed, and solder resists can be applied, to complete the printed circuit board 10 as illustrated in FIG. 7.

Figure 8:
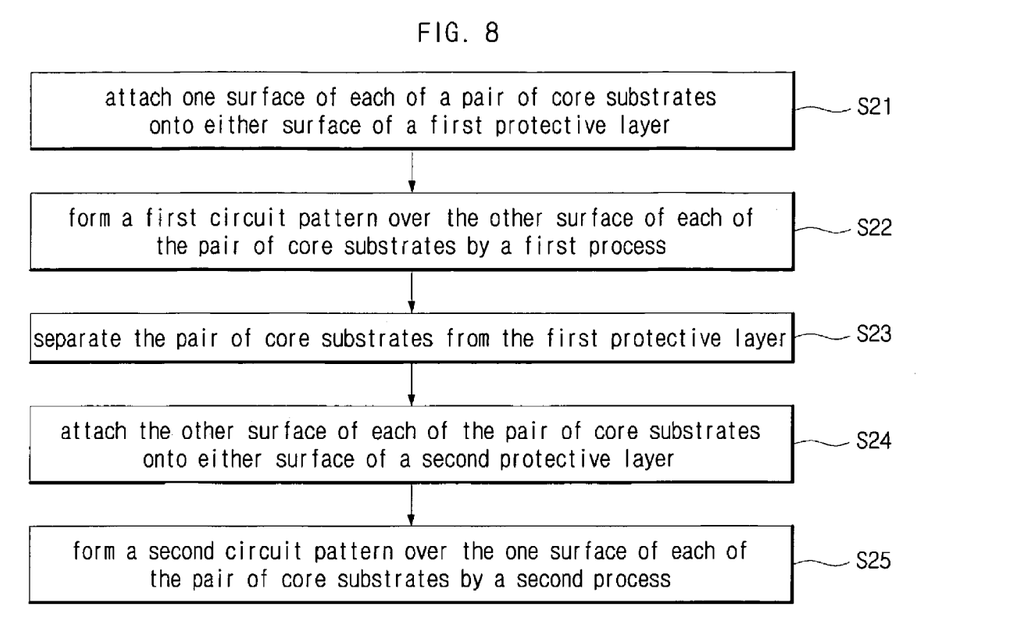
FIG. 8 is a flowchart illustrating the manufacture of a printed circuit board according to another embodiment of the invention.

FIG. 8 is a flowchart illustrating the manufacture of a printed circuit board according to another embodiment of the invention, and FIG. 9 through FIG. 14 are cross sectional views representing a flow diagram illustrating the manufacture of a printed circuit board according to another embodiment of the invention. In FIGS. 9 to 14, there are illustrated core substrates 21, insulation layers 211, copper foils 212, a first protective layer 22, via holes 23, first circuit patterns 24, vias 25, a second protective layer 26, and second circuit patterns 27.

Figure 9:
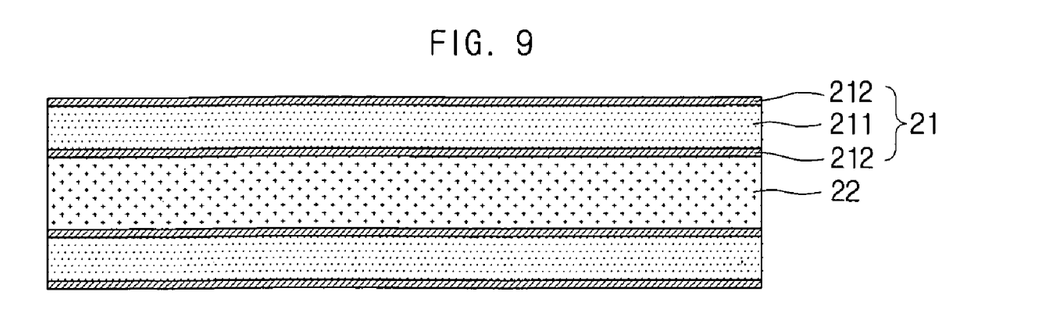
FIG. 9, FIG. 10, FIG. 11, FIG. 12, FIG. 13, and FIG. 14 are cross sectional views representing a flow diagram illustrating the manufacture of a printed circuit board according to another embodiment of the invention.

Operation S21 may include attaching one surface of each of a pair of core substrates 21 to either surface of a first protective layer 22. FIG. 9 represents a corresponding procedure.

In this particular embodiment, the pair of core substrates 21 can be attached to both surfaces of the first protective layer 22 in a symmetrical arrangement.

The core substrates 21 can be made from just the insulation layers. This particular embodiment illustrates the use of copper clad laminates (CCL). A copper clad laminate (CCL) can include a copper foil on just one surface of the insulation layer, or as illustrated in this particular embodiment, include copper foils 212 stacked over both surfaces of the insulation layer 211.

The thickness of a copper foil 212 can be such that allows the application of a tenting process. Also, the copper foil can be such that is thin enough to allow the application of a semi-additive process.

A tape, such as a foam tape, can be used for the first protective layer 22, whereby the surfaces of the core substrates 21 can be protected in a simple manner from a plating liquid or etchant, etc., making it possible to form each of the first circuit patterns 24 and second circuit patterns 27 sequentially.

Figure 10:
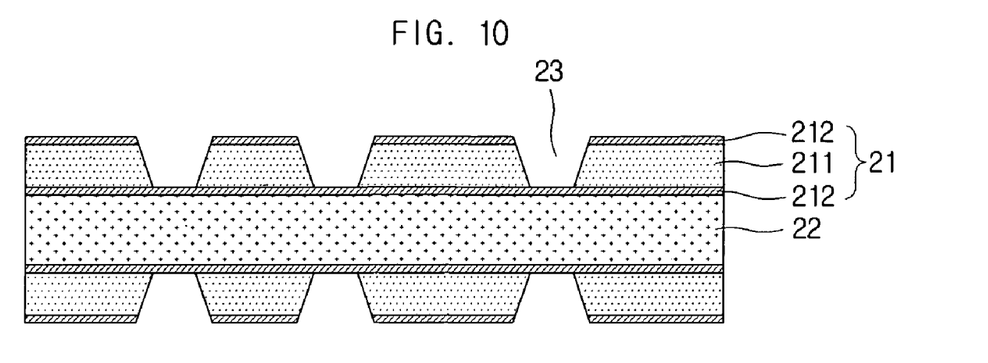
Figure 11:
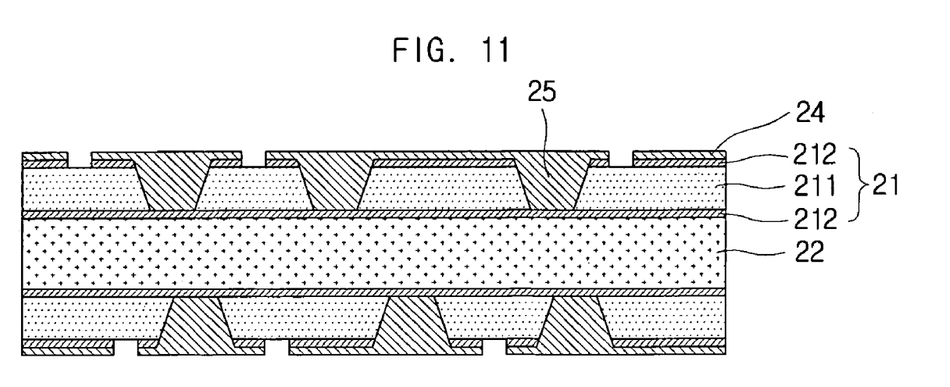

Operation S22 may include forming a first circuit pattern 24 over the other surface of each of the pair of core substrates 21, where FIG. 10 and FIG. 11 represent corresponding procedures.

Before forming the second circuit patterns 27, via holes 23 can be perforated, as illustrated in FIG. 10, to form vias 25 for connecting the circuit patterns 24, 27. A laser can be used for perforating the via holes 23. Afterwards, the insides of the via holes 23 can be plated to form the vias 25.

The first process can be any of a semi-additive process, tenting process, and additive process. In this particular embodiment, the first circuit patterns 24 may be formed by a tenting process. In cases where the core substrates 21 are made only of insulation layers, an additive process may be used. An additive process may include selectively forming a circuit pattern over the insulation layer by electroless plating or electroplating. A semi-additive process may include selectively forming a circuit pattern over a thin film of copper, and then removing the exposed copper by etching.

Operation S23 may include separating the pair of core substrates 21 from the first protective layer 22. The first protective layer 22 can be physically separated or can be removed using a chemical solution. If a foam tape is used for the first protective layer 22, increasing the temperature can create bubbles in the tape, so that the adhesion may be lowered and the tape may easily be separated from the core substrates 21.

Figure 12:
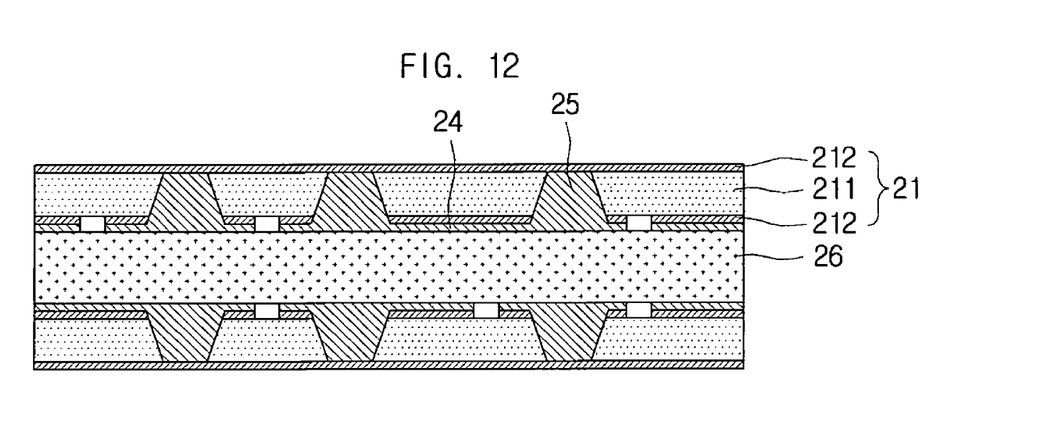

Operation S24 may include attaching the other surface of each of the pair of core substrates 21 to either surface of a second protective layer 26, where FIG. 12 represents a corresponding procedure.

The other surface of each core substrate 21 may already have the first circuit pattern 24 formed by the first process. Therefore, the second protective layer 26 can be attached to the other surface of each core substrate 21, in order that the first circuit pattern 24 may not be damaged. The second protective layer 26 can be made from the same material as that of the first protective layer 22. In this embodiment, the pair of core substrates 21 can be attached to the second protective layer 26 symmetrically.

Figure 13:
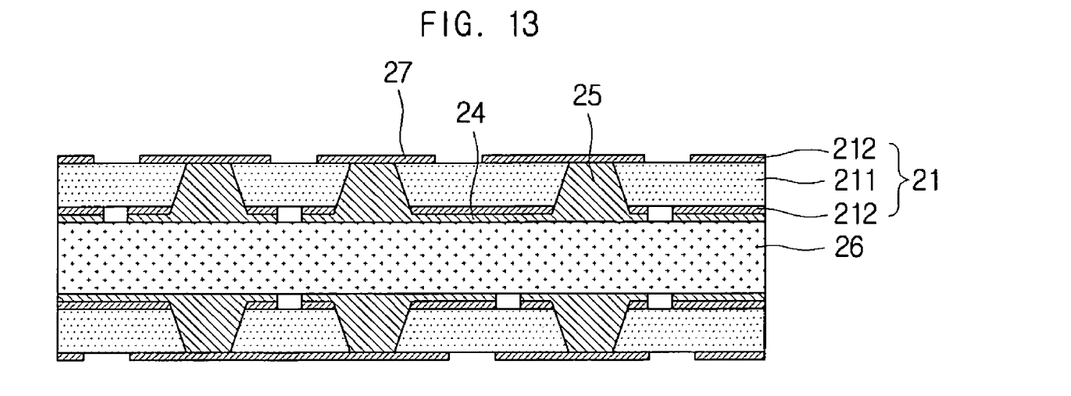

Operation S25 may include forming a second circuit pattern 27 over the one surface of each of the pair of core substrates 21 using a second process, where FIG. 13 represents a corresponding procedure.

One surface of each of the pair of core substrates 21 may be exposed, after the removal of the first protective layer 22. In this particular embodiment, the core substrates 21 may be copper clad laminates, and thus the copper foils 212 may be exposed, as illustrated in FIG. 12.

The second process can be a tenting process of removing portions of the copper foils 212. If the copper foils are thin, it is possible to form the second circuit patterns 17 by a semi-additive process and then remove the exposed portions of the copper foils. If the one surface of each of the core substrates 21 is an insulation layer, an additive process can be used for forming the second circuit patterns 27.

Since the first circuit patterns 24 can be formed using an additive or a semi-additive process, and the second circuit patterns 27 can be formed using a tenting process, the sides of the second circuit patterns 27 can form lower inclinations with respect to the insulation layer 211, compared to the sides of the second circuit patterns 27.

One reason for this may be that, because of the tenting process, the upper portions on the sides of the second circuit patterns 27 may be exposed more to the etchant than are the lower portions and may thus be removed more.

The first circuit patterns 24, on the other hand, can each have an interface formed within, because of the additional plating procedure included for forming the vias 25.

Figure 14:
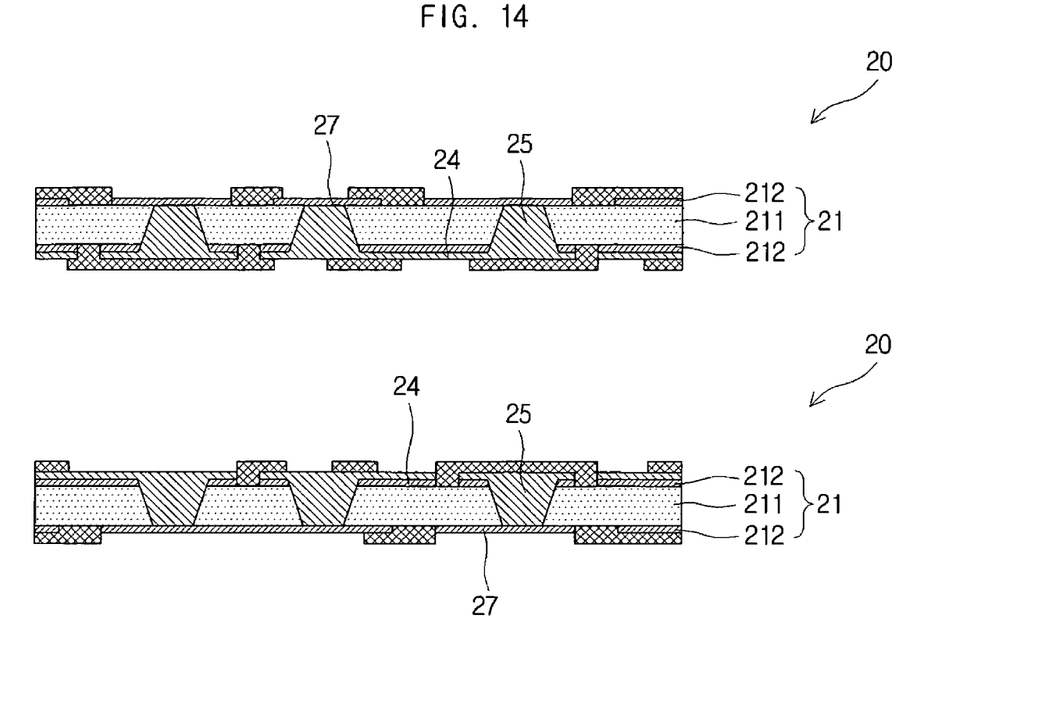

Afterwards, the second protective layer 26 can be removed, and solder resists can be applied, to complete a pair of printed circuit boards 20 as illustrated in FIG. 14. Each printed circuit board 20 can be a complete product in itself.

Figure 15:
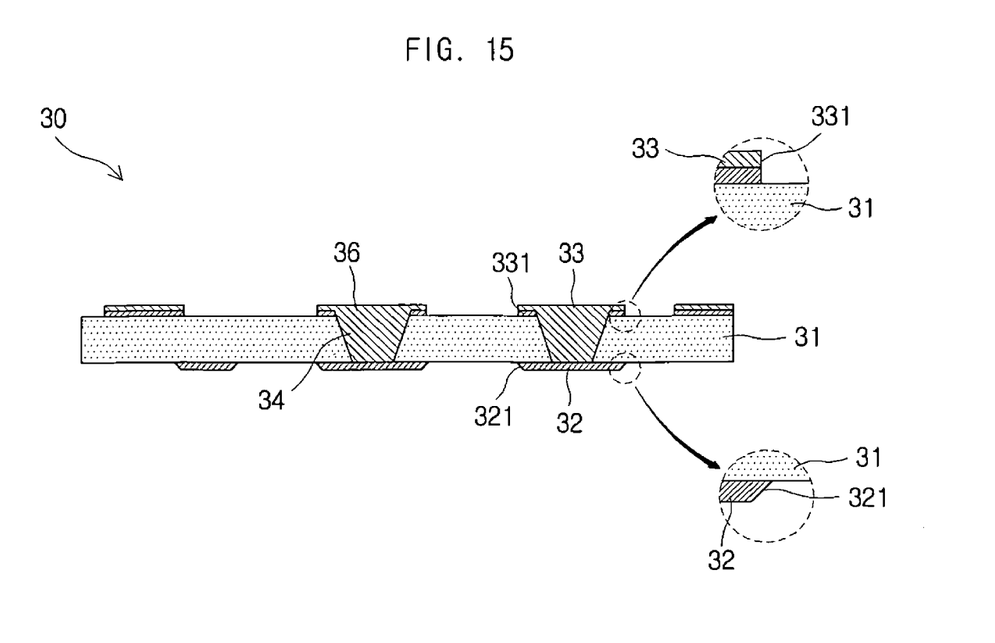
FIG. 15 is a cross sectional view of a printed circuit board according to yet another embodiment of the invention.

FIG. 15 is a cross sectional view of a printed circuit board according to yet another embodiment of the invention. In FIG. 15, there are illustrated a printed circuit board 30, an insulation layer 31, a first circuit pattern 33, a second circuit pattern 32, and vias 34.

The printed circuit board 30 according to this embodiment may have a first circuit pattern 33 and a second circuit pattern 32 formed respectively on either surface. The second circuit pattern 32 can be formed by a tenting process, so that the sides 321 of the second circuit pattern 32 can be slanted with respect to the insulation layer 31.

The sides 331 of the first circuit pattern 33, however, may be slanted by a greater inclination from the insulation layer 31 compared to the sides 321 of the second circuit pattern 32, as the first circuit pattern 33 can be formed by an additive or a semi-additive process.

A tenting process can involve removing unnecessary portions with an etchant and having the remaining portions form the circuit pattern. Here, the upper portions of the circuit pattern can be exposed more to the etchant and thus can be removed more. Therefore, the sides 321 of the second circuit pattern 32 can form a smaller inclination with the insulation layer 31 compared to those of the first circuit pattern 33, as is illustrated in FIG. 15.

The first circuit pattern 33 can have an interface 36 formed within, because of the extra plating procedure involved in forming the vias 34.

According to certain aspects of the invention as set forth above, circuit patterns can be formed sequentially on either surface of a printed circuit board, making it possible to apply a different process for forming the circuit pattern on each surface of the printed circuit board.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, many embodiments other than those set forth above can be found in the appended claims.

What is claimed is:

1. A method of manufacturing a printed circuit board, the method comprising:
   forming a first protective layer over one surface of a core substrate;
   forming a first circuit pattern over the other surface of the core substrate by a first process;
   removing the first protective layer;
   forming a second protective layer over the other surface of the core substrate; and
   forming a second circuit pattern over the one surface of the core substrate by a second process,
   wherein the first and second protective layers are foam tapes.

2. The method of claim 1, wherein the core substrate is a copper clad laminate (CCL).

3. The method of claim 1, wherein the first process is any one selected from a group consisting of a tenting process, a semi-additive process, and an additive process.

4. The method of claim 1, wherein the second process is any one selected from a group consisting of a tenting process, a semi-additive process, and an additive process.

5. The method of claim 1, wherein the first process is a semi-additive process or an additive process,
   the second process is a tenting process, and
   a side of the second circuit pattern is less slanted than a side of the first circuit pattern.

6. The method of claim 1, wherein the first process is a semi-additive process.

7. A method of manufacturing a printed circuit board, the method comprising:

attaching one surface of each of a pair of core substrates onto either surface of a first protective layer;

forming a first circuit pattern over the other surface of each of the pair of core substrates by a first process;

separating the pair of core substrates from the first protective layer;

attaching the other surface of each of the pair of core substrates onto either surface of a second protective layer; and forming a second circuit pattern over the one surface of each of the pair of core substrates by a second process, wherein the first and second protective layers are foam tapes.

8. The method of claim 7, wherein the core substrates are copper clad laminates (CCL).

9. The method of claim 7, wherein the first process is any one selected from a group consisting of a tenting process, a semi-additive process, and an additive process.

10. The method of claim 7, wherein the second process is any one selected from a group consisting of a tenting process, a semi-additive process, and an additive process.

11. The method of claim 7, wherein the first process is a semi-additive process or an additive process, the second process is a tenting process, and a side of the second circuit pattern is less slanted than a side of the first circuit pattern.

12. The method of claim 7, wherein the first process is a semi-additive process.

* * * * *